United States Patent [19]
Buschbom

[11] Patent Number: 5,834,335
[45] Date of Patent: Nov. 10, 1998

[54] NON-METALLURGICAL CONNECTION BETWEEN AN INTEGRATED CIRCUIT AND A CIRCUIT BOARD OR ANOTHER INTEGRATED CIRCUIT

[75] Inventor: Milton L. Buschbom, Plano, Tex.

[73] Assignee: Texas Instruments Incorporated, Dallas, Tex.

[21] Appl. No.: 721,801

[22] Filed: Sep. 27, 1996

Related U.S. Application Data

[60] Provisional application No. 60/004,425, Sep. 28, 1995.

[51] Int. Cl.$^6$ .................................................. H01L 21/44
[52] U.S. Cl. ........................... 438/107; 438/108; 438/109
[58] Field of Search .................................. 438/107, 108, 438/109; 257/777, 778, 785

[56] References Cited

U.S. PATENT DOCUMENTS

| | | | |
|---|---|---|---|
| 4,647,959 | 3/1987 | Smith | 357/74 |
| 4,922,376 | 5/1990 | Pommer et al. | 361/386 |
| 4,949,148 | 8/1990 | Bartelink | 357/74 |
| 5,089,880 | 2/1992 | Meyer et al. | 357/75 |
| 5,239,447 | 8/1993 | Cotues et al. | 437/209 |
| 5,283,468 | 2/1994 | Kondo et al. | 257/774 |
| 5,489,804 | 2/1996 | Pasch | 437/214 |
| 5,508,230 | 4/1996 | Anderson et al. | 437/209 |
| 5,528,462 | 6/1996 | Pendse | 257/778 |
| 5,585,671 | 12/1996 | Nagesh et al. | 257/778 |
| 5,677,576 | 10/1997 | Akagawa | 257/785 |
| 5,701,233 | 12/1997 | Carson et al. | 257/777 |

OTHER PUBLICATIONS

DiFrancesco, Larry, "Part Interconnect: A New Interrconnect Technology", *Apart From the Crowd, Proceedings of The Technical Program*, Surface Mount International Conference & Exposition, San Jose, California, Aug. 29–Sep. 2, 1993.

Portions from SEMATECH handout, BGA Infrastructure Workshop, Dallas, Texas, Oct. 12–14, 1994.

Nov., 1992 Catalog of Semiconductor Accessories, Thermalloy, Inc.

*Primary Examiner*—Ollk Chaudhuri
*Assistant Examiner*—Kevin F. Turner
*Attorney, Agent, or Firm*—Robert D. Marshall, Jr.; James C. Kesterson; Richard L. Donaldson

[57] ABSTRACT

A method is disclosed for making a non-metallurgical connection between an integrated circuit (16) and either a circuit board (12) or second integrated circuit. In one embodiment, an electrical connection is formed between terminals (28) of an integrated circuit (16) and pads (20) on a circuit board (12) without metallurgically connecting the terminals (28) and pads (20). The integrated circuit (16) can be in either packaged or die form. A clamping mechanism (18, 36) attached to the circuit board (12) clamps the integrated circuit (16) to the circuit board (12).

20 Claims, 1 Drawing Sheet

NON-METALLURGICAL CONNECTION BETWEEN AN INTEGRATED CIRCUIT AND A CIRCUIT BOARD OR ANOTHER INTEGRATED CIRCUIT

TECHNICAL FIELD OF THE INVENTION

This invention relates generally to attachment of integrated circuits to circuit boards or other integrated circuits and more particularly to a method and apparatus for making a non-metallurgical connection between an integrated circuit in packaged or die form and a circuit board or second integrated circuit.

BACKGROUND OF THE INVENTION

Surface-mount technologies are increasingly being used for integrated circuits. For example, one surface-mount technology is the ball grid array (BGA). A ball grid array has a series of terminals on the underside of an integrated circuit that are somewhat spherical in shape. These terminals can be arranged in multiple rows around the periphery of the underside of the integrated circuit. Because multiple rows can be used, a higher number of terminals can exist in a ball grid array in comparison to some other technologies. Yet, an integrated circuit package can also be made smaller. Currently, a ball grid array is connected to a printed circuit board by soldering the balls to contacts on the printed circuit board. Other forms of metallurgical connection can also be made.

For many surface mount devices, however, metallurgical connections can create problems. Heat generated during the operation of an integrated circuit can cause significant expansion of the integrated circuit package. Often, an integrated circuit has a different thermal coefficient of expansion than that of the printed circuit board. Thermal expansion of the integrated circuit in these circumstances will cause the terminals on the integrated circuit to move relative to the pads on the circuit board. Expansion caused by heating of the integrated circuit during operation can cause thermal stress in the metallurgical connections between the balls of a ball grid array and the pads on a printed circuit board. Similar stress can also occur with other surface mount integrated circuit technologies. Eventually, thermal stress can cause cracking of the metallurgical connections between the balls and the pads, either creating an open circuit or a higher resistance connection between one or more leads of the integrated circuit and the printed circuit board. These events can cause the failure of both the integrated circuit and the apparatus in which the integrated circuit is being used.

Designers seeking to avoid cracking of metallurgical connections due to thermal stress have employed sockets to accept a surface mount device. For many applications, sockets are an unacceptable solution. First, a socket for a surface mounted device can be expensive. Second, a socket adds parasitic resistance, inductance, and capacitance that may interfere with the proper performance of the integrated circuit. Third, the socket adds additional height to the circuit, reducing the number of such circuit cards that can fit inside a particular enclosure.

A method is needed that will create a good electrical connection between a surface-mounted integrated circuit and another integrated circuit or a circuit board without metallurgically connecting one or more terminals on the integrated circuit. The method should also avoid the use of a socket.

SUMMARY OF THE INVENTION

The method of the present invention allows an integrated circuit, in either packaged or die form, to be connected either to another integrated circuit or to a printed circuit board without metallurgically connecting at least one terminal thereon. In one embodiment of the invention, an electrical connection is formed between a terminal on an integrated circuit and a pad on a circuit board without metallurgically connecting the terminal and pad. A clamping mechanism fastened to the circuit board clamps the integrated circuit to the circuit board.

The invention has several important technical advantages. It provides an alternative to the creation of metallurgical connections between (1) an integrated circuit package or die, and (2) another integrated circuit package or a circuit board. The invention provides a holding mechanism for an integrated circuit while avoiding the thermal expansion problems associated with metallurgical connections. It also avoids the parasitic resistance, inductance and capacitance that are encountered when using a socket. Also, the disclosed method allows a lower profile connection between integrated circuit packages or dies and other integrated circuits or circuit boards, thus reducing the overall thickness of the assembled combination.

Because no metallurgical connection is made, the connection is non-permanent. If an integrated circuit ceases to function, it can be easily removed and replaced with a functioning integrated circuit without encountering the problems inherent in removal where metallurgical connections are used. In addition, easy removability allows an earlier generation integrated circuit to be replaced by a later generation integrated circuit more easily. Thus, the invention allows attainment of the benefits of a socket without the corresponding problems encountered when using a socket.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
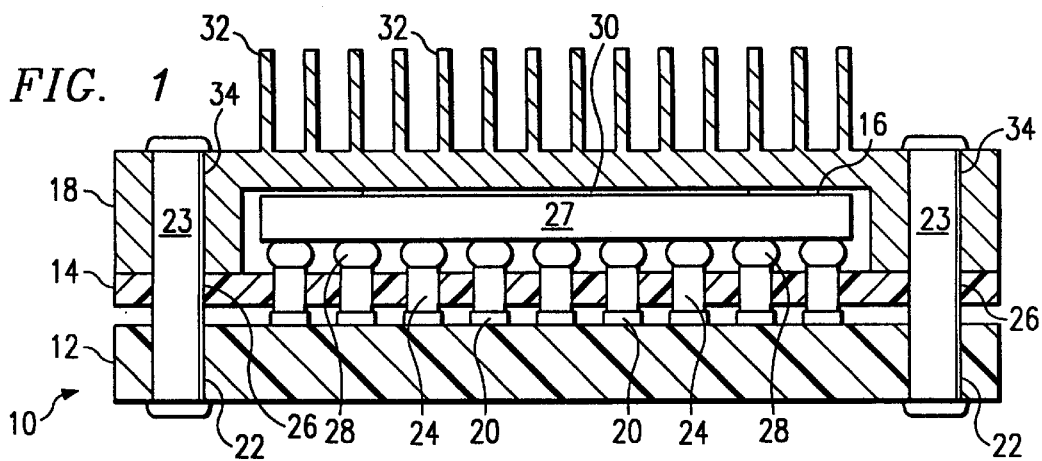
FIG. 1 illustrates an electronic apparatus with an integrated circuit attached using one embodiment of the invention.

FIG. 1 illustrates an electronic apparatus 10 with an integrated circuit 16 attached using one embodiment of the invention. Electronic apparatus 10 comprises circuit board 12, interposer 14, integrated circuit 16, and heat sink 18. In accordance with the invention, an electrical connection is formed between integrated circuit 16 and circuit board 12 without metallurgically connecting the terminals of integrated circuit 16 to the pads of circuit board 12. A clamping mechanism, which comprises heat sink 18 in this embodiment, clamps integrated circuit 16 to circuit board 12.

Circuit board 12 comprises pads 20 and anchor openings 22. Anchor openings 22 receive anchors 23 which aid in clamping integrated circuit 16 to circuit board 12. Pads 20 are conductive pads of the type typically found on printed circuit boards. In this embodiment, pads 20 comprise conductors that are prone to oxidation.

Interposer 14 lies between integrated circuit 16 and circuit board 12. Interposer 14 comprises a plurality of contacts 24 and openings 26. Openings 26, like anchor openings 22, receive anchors 23 which aid in holding interposer 14 in place on electronic apparatus 10.

In this embodiment, interposer 14 comprises a membrane-type interposer. Contacts 24 are formed using particle interconnect technology. These contacts 24 have a large number of asperities, having very sharp and hard points because they are made of particles such as diamond particles, carbides, oxides, and/or other abrasive materials. As will be discussed below, this aspect of contacts 24 aids in forming a good electrical connection between integrated circuit 16 and circuit board 12. In this example, each contact 24 connects one of the pads 20 of circuit board 12 to one of the terminals 28 of integrated circuit 16, thus providing an electrical connection between the terminals 28 and pads 20.

Integrated circuit 16 comprises package 27, terminals 28, and heat slug 30. Heat slug 30 aids in expelling heat generated by integrated circuit 16. In this example, integrated circuit 16 is a surface-mounted ball grid array. Thus, each of terminals 28 may also be referred to as balls. Terminals 28 comprise a conductor, such as solder, prone to oxidation. Each of the terminals 28 is electrically connected to a pad 20 on circuit board 10 through a contact 24. Contacts 24 serve as a direct connection between terminals 28 and pads 20.

Heat sink 18 serves multiple purposes. It contacts heat slug 30 on integrated circuit 16 and performs its normal function of helping to draw out and expel heat from integrated circuit 16. Fins 32 aid in removing heat from integrated circuit 16. In addition, heat sink 18 serves as a clamping mechanism providing mechanical pressure to clamp integrated circuit 16 to circuit board 12. Heat sink 18 is fastened to circuit board 10 by anchors 23 that pass through anchor openings 34 in heat sink 18. Either heat sink 18 or anchors 23 may be spring-loaded to provide additional mechanical pressure to hold integrated circuit 16 in position on circuit board 12. In this example, anchors 23 are plastic posts.

The operation of the invention can also be understood by referring to FIG. 1. When electronic apparatus 10 is operational, integrated circuit 16 will become hot. Integrated circuit 16 will often have a different coefficient of thermal expansion than that of circuit board 12. Consequently, when integrated circuit 16 becomes hot, it will expand and the terminals 28 of integrated circuit 16 will move relative to pads 20 on circuit board 12. Because no metallurgical connection is formed between terminals 28 and pads 20, thermal stress does not break the connection between terminals 28 and pads 20. Instead, a good electrical contact is maintained, increasing the longevity of both integrated circuit 16 and electronic apparatus 10.

In fact, the invention uses thermal expansion advantageously. Because terminals 28 and/or pads 20 may be prone to oxidation, it is desirable to have a mechanism to reduce such oxidation so as to maintain a good electrical connection between terminals 28 and pads 20. The thermal expansion of integrated circuit 16 and circuit board 12 causes the pads 20 and terminals 28 to rub against the surface of contacts 24. The sharp edges on the surface asperities of contacts 24 create a scrubbing action that reduces the oxidation of terminals 28 and/or pads 20.

If integrated circuit 16 is no longer functional or if an improved version of integrated circuit 16 has been developed, integrated circuit 16 may be easily replaced by removing anchors 23 and heat sink 18. A new integrated circuit 16 can replace the existing integrated circuit 16 and then be clamped in place by heat sink 18 and anchors 23.

Unlike a socket, interposer 14 provides a good electrical connection between terminals 28 and pads 20 without adding a significant amount of parasitic resistance, inductance or capacitance. In addition, because interposer 14 is relatively thin, the overall height of electronic apparatus 10 is lower than it would be if a socket was used for integrated circuit 16. In most cases, interposer 14 will also be less expensive than a socket for integrated circuit 16.

Figure 2:
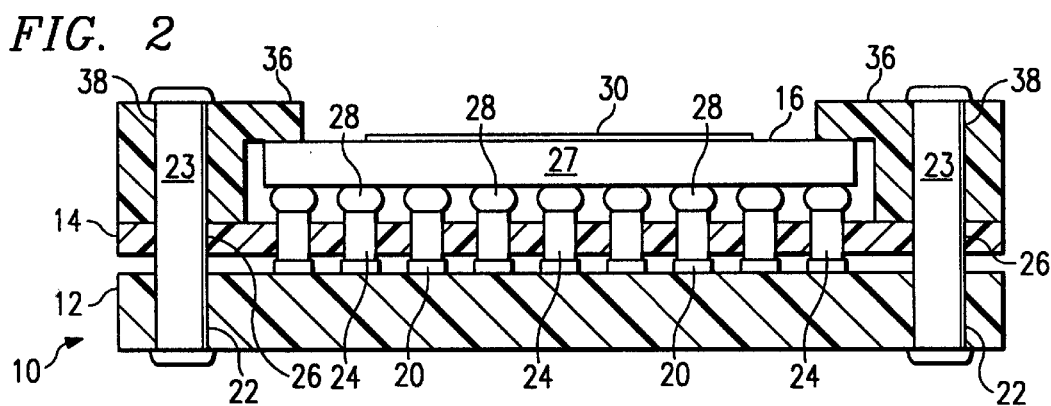
FIG. 2 illustrates an electronic apparatus with an integrated circuit attached using a second embodiment of the invention.

FIG. 2 illustrates an electronic apparatus 10 with an integrated circuit 16 attached using a second embodiment of the invention. This embodiment is similar to that of the embodiment illustrated in FIG. 1, except that clamps 36 are used in place of heat sink 18, or a different style of heat sink 18 will be used that does not serve as a clamping mechanism. In some applications, integrated circuit 16 will not require a heat sink 18. In such applications, clamps 36 may be used as a clamping mechanism to clamp integrated circuit 16 to circuit board 12. Clamps 36 each have an anchor opening 38 to allow anchors 33 to pass through them. Clamps 36 are made of plastic. They can be spring loaded, as can anchors 23, to aid in securely clamping integrated circuit 16 to circuit board 12. Spring loading may be especially useful where the heights of pads 20 and/or terminals 28 vary considerably in comparison with one another.

Figure 3:
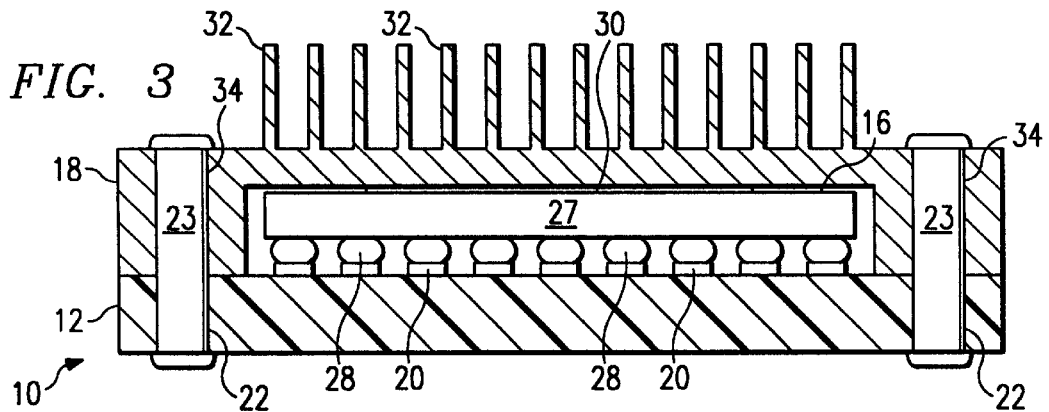
FIG. 3 illustrates an electronic apparatus with an integrated circuit attached using a third embodiment of the invention.

FIG. 3 illustrates an electronic apparatus 10 with an integrated circuit 16 attached using a third embodiment of the invention. This embodiment is similar to the embodiment illustrated in FIG. 1 except that the embodiment in FIG. 3 has omitted interposer 14. As discussed above, interposer 14 provides a scrubbing mechanism to prevent terminals 28 and pads 20 from oxidizing, thus maintaining a good electrical connection between them. If, however, pads 20 and terminals 28 comprise a conductive material, such as gold, that does not oxidize easily, the scrubbing mechanism can be omitted. Alternatively, pads 20 can be coated with particles such as diamond particles using particle interconnect technology to create a large number of asperities on pads 20. If this method is chosen, the surface asperities on pads 20 themselves will serve as a scrubbing mechanism for terminals 28.

Figure 4:
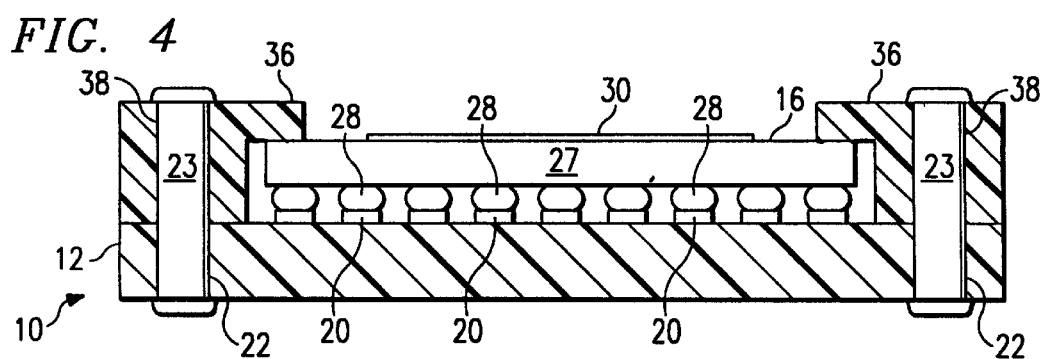
FIG. 4 illustrates an electronic apparatus with an integrated circuit attached using a fourth embodiment of the invention.

FIG. 4 illustrates an electronic apparatus 10 with an integrated circuit 16 attached using a fourth embodiment of the invention. This embodiment is similar to the embodiment illustrated in FIG. 2 except interposer 14 has been omitted. Like the embodiment illustrated in FIG. 3, interposer 14 can be omitted either where terminals 28 and pads 20 comprise a conductive material, such as gold, that does not oxidize easily, or when pads 20 have been coated with a scrubbing mechanism such as the diamond particles discussed in connection with FIG. 3.

It should be understood that the invention is not limited to the illustrated structures and that a number of substitutions can be made without departing from the scope and teachings of the present invention. For example, interposer 14 is a membrane-type interposer using a thin film circuit. Other types of interposers could be used. In addition, interposer 14 employs contacts 24 with high number of surface asperities created using particle interconnect technology. Contacts 24 could also have other types of contacts such as embedded fine wires, spring wire contacts, cylindrical mesh members such as manufactured by Tecknit Interconnection Products of New Jersey under the trademark FUZZ BUTTON ®, etc. Interposer 14 could also be an elastomeric interposer. Interposer 14 has straight-through contacts 24. Alternatively, a fan-out type interposer could be used.

In this embodiment, anchors 23 are plastic stakes which may or may not be spring loaded. Alternatively, screws, rivets or other types of fasteners could be used for anchors 23.

Heat sink 18 and clamps 36 are examples of clamping mechanisms that can be used to clamp integrated circuit 16 to circuit board 12. Other types of clamping mechanisms could be used. In addition, different types of heat sinks could be used and fins 32 could be omitted. Different types of clamps 36 could also be used and made of a material other than plastic. Clamps 36 and heat sink 18 may or may not be spring loaded.

In the illustrated embodiments, integrated circuit 16 is a packaged integrated circuit. Alternatively, integrated circuit 16 could be a circuit die also known as a chip. For purposes of this application, the term "integrated circuit" refers to either a packaged or unpackaged integrated circuit. Thus, the invention can be used for making non-metallurgical connections between a packaged or unpackaged integrated circuit and a printed circuit board.

In addition, the invention has been illustrated in the context of connecting an integrated circuit 16 to a printed circuit board 12. Alternatively, printed circuit board 12 could be another integrated circuit. In other words, a packaged integrated circuit or a die could be electrically connected to another integrated circuit using the invention. The invention may thus be especially useful for multi-chip modules or for other subassemblies.

In the illustrated example, integrated circuit 16 is a ball grid array and interposer 14 was designed for use with a ball grid array. However, the invention may be used with numerous surface mount technologies. An appropriate interposer 14 can be selected depending upon the surface-mount technology used for integrated circuit 16. Other examples of surface mount technologies with which the present invention can be used include solder grid arrays (SGAs), solder column arrays (SCAs), land grid arrays (LGAs), quad flat packs (QFPs), flat packs (FPs), plastic leaded chip carriers (PLCCs), small outline integrated circuits (SOICs), small outline packages (SOPs), shrink small outline packages (SSOPs), pin grid arrays (PGAs), component blocks such as SIMM modules, 3-D stacks, and/or any other surface mount technology.

Although the present invention has been described in detail, it should be understood that various changes, substitutions, and alterations can be made hereto without departing from the spirit and scope of the invention as defined by the appended claims.

What is claimed is:

1. A method for making a nonmetallurgical connection between an integrated circuit and a circuit board, comprising:

forming a first pad on the circuit board having a large number of asperites;

forming an electrical connection between a first terminal of the integrated circuit and the first pad on the circuit board without metallurgically connecting the first terminal and the first pad; and clamping the integrated circuit to the circuit board using a clamping mechanism, wherein the clamping mechanism is fastened to the circuit board.

2. The method of claim 1 wherein the clamping mechanism comprises an external heat sink.

3. The method of claim 1 wherein the clamping mechanism comprises a plastic frame.

4. The method of claim 1, further comprising:

positioning an interposer between the integrated circuit and the circuit board, the interposer comprising a first contact electrically connecting the first terminal and the first pad.

5. The method of claim 4, wherein the clamping mechanism comprises an external heat sink.

6. The method of claim 4, wherein the clamping mechanism comprises a plastic frame.

7. The method of claim 1, wherein the clamping mechanism is spring-loaded.

8. A method for making a nonmetallurgical connection between a first integrated circuit and a second integrated circuit, comprising:

forming a first pad on the second integrated circuit having a large number of asperites;

forming an electrical connection between a first terminal of the integrated circuit and the first pad on the second integrated circuit without metallurgically connecting the first terminal and the first pad; and clamping the first integrated circuit to the second integrated circuit using a clamping mechanism, wherein the clamping mechanism is fastened to the second integrated circuit.

9. The method of claim 8, further comprising:

positioning an interposer between the first integrated circuit and the second integrated circuit, the interposer comprising a first contact electrically connecting the first terminal and the first pad.

10. The method of claim 8 wherein the clamping mechanism comprises an external heat sink.

11. The method of claim 1 wherein:

the step of forming a first pad on the circuit board having a large number of asperites consists of disposing a particulate material having a large number of very sharp and hard points on said first pad.

12. The method of claim 11 wherein:
the particular material includes diamond particles.

13. The method of claim 11 wherein:
the particular material includes carbides.

14. The method of claim 11 wherein:
the particular material includes oxides.

15. The method of claim 11 wherein:
the particular material includes abrasive.

16. The method of claim 8 wherein:
the step of forming a first pad on the circuit board having a large number of asperites consists of disposing a particulate material having a large number of very sharp and hard points on said first pad.

17. The method of claim 16 wherein:
the particular material includes diamond particles.

18. The method of claim 16 wherein:
the particular material includes carbides.

19. The method of claim 16 wherein:
the particular material includes oxides.

20. The method of claim 16 wherein:
the particular material includes abrasive.

* * * * *